United States Patent
Ashrafzadeh et al.

(10) Patent No.: US 7,969,002 B2
(45) Date of Patent: Jun. 28, 2011

(54) INTEGRATED CIRCUIT PACKAGES INCORPORATING AN INDUCTOR AND METHODS

(75) Inventors: Ahmad Ashrafzadeh, Morgan Hill, CA (US); Mansour Izadinia, Cupertino, CA (US); Nitin Kalje, Cupertino, CA (US); Ignacio McQuirk, Los Altos, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 120 days.

(21) Appl. No.: 12/260,303

(22) Filed: Oct. 29, 2008

(65) Prior Publication Data

US 2010/0102416 A1    Apr. 29, 2010

(51) Int. Cl.
*H01L 23/06* (2006.01)
(52) U.S. Cl. .......... 257/729; 257/E23.053; 257/E23.079
(58) Field of Classification Search ................ 257/729, 257/E23.053, E23.054, E23.079
See application file for complete search history.

(56) References Cited

U.S. PATENT DOCUMENTS

| 5,161,098 A * | 11/1992 | Balakrishnan ............... 363/144 |
| 5,949,295 A | 9/1999 | Schmidt | |
| 2006/0145800 A1 | 7/2006 | Dadafshar et al. | |
| 2007/0075817 A1 | 4/2007 | Lotfi et al. | |
| 2009/0134503 A1 * | 5/2009 | Feng et al. .................... 257/673 |

FOREIGN PATENT DOCUMENTS

EP    0531687    3/1993

OTHER PUBLICATIONS

"International Search Report and Written Opinion of the International Searching Authority Dated Jan. 12 2010", International Application No. PCT/US2009/059581.

* cited by examiner

*Primary Examiner* — Benjamin P Sandvik
*Assistant Examiner* — W. Wendy Kuo
(74) *Attorney, Agent, or Firm* — Blakely Sokoloff Taylor & Zafman LLP

(57) ABSTRACT

Integrated circuit packages incorporating an inductor and methods for their fabrication. The lead frame used in packaging the integrated circuit includes a first area for receiving the integrated circuit, and a second area having a plurality of connections from one side to the other side of the lead frame, thereby forming coil segments. After mounting the integrated circuit and wire bonding its connections, the lead frame is placed on a ferrite plate, the assembly is encapsulated in resin, and the leads trimmed and bent. Mounting of the packaged integrated circuit on a properly prepared printed circuit interconnects the coil segments in the package to coil segments on the printed circuit, thereby forming a single, multi-turn coil around the ferrite plate. Various embodiments are disclosed.

10 Claims, 5 Drawing Sheets

INTEGRATED CIRCUIT PACKAGES INCORPORATING AN INDUCTOR AND METHODS

BACKGROUND OF THE INVENTION

1. Field of the Invention

The present invention relates to the field of integrated circuit packaging.

2. Prior Art

A number of well known prior art circuits require an inductor for proper operation. Such circuits include switching power supplies which receive an input voltage, typically unregulated, and provide a regulated voltage to the circuits powered thereby. For large power supplies, the switching transistors, as well as the inductor and output capacitor, are normally discrete devices, though for smaller power supplies, the switching transistors can be integrated into the controller integrated circuit. In an effort to make smaller and simpler power supplies, the industry has been considering various methods of incorporating the inductor into the integrated circuit package for such supplies. Most of these efforts have been around an integrated circuit process that incorporates the inductor or a substrate that can have the magnetic material and minimal winding to form the inductor inside the package. All of the prior art produces small inductance with high resistance and high cost. However the ability to incorporate the inductor into the integrated circuit, or at least the integrated circuit package, is still a highly desirable goal to reduce component count and the circuit board area required, both of which reduce costs and enhance product appeal.

DETAILED DESCRIPTION OF THE PREFERRED EMBODIMENTS

Preferred embodiments of the present invention are described herein and illustrated in the Figures. It is to be understood, however, that the Figures illustrate the invention schematically, though are illustrative of the principles of the invention. Also the phrase "lead frame" as used herein and in the claims to follow refers to a complete lead frame having lead frame leads and typically a pad for the mounting of an integrated circuit, all initially physically connected together adjacent the lead frame periphery, as used in the packaging of integrated circuits, and may also refer to component parts of a lead frame before or after physical separation of the component parts thereof. By way of example, the phrase lead frame leads may refer to the lead portion of a complete lead frame, or the leads after physical separation, depending on the context such phrase is used.

Figure 1:
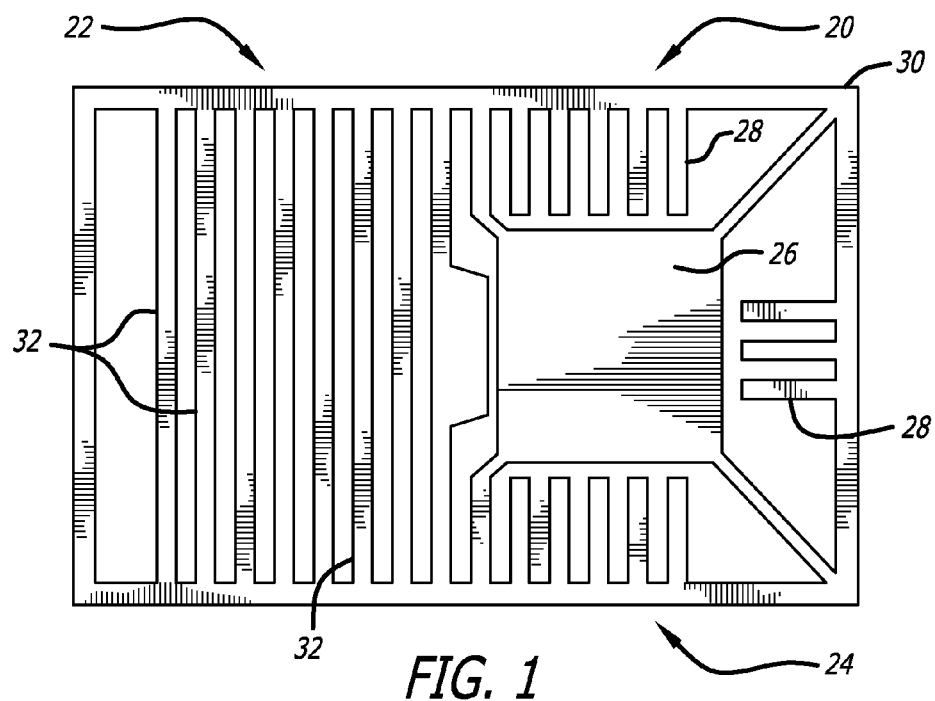
FIG. 1 is a schematic top view of an exemplary lead frame that may be used with the present invention.

FIG. 1 is a plan view of a lead frame 20 in accordance with the present invention. The lead frame is comprised of two primary lead frame areas, namely, the lead frame area 22 at the left of the lead frame 20 and the lead frame area 24 at the right of the lead frame 20. The lead frame area 24 is of substantially conventional design, being comprised of a pad 26 for receiving an integrated circuit and a plurality of leads 28, all supported by an integral lead frame region 30 circumscribing the lead frame. The right area 22 of the lead frame is simply comprised of a plurality of connections 32, extending from one side of the lead frame to the opposite side.

Figure 2:
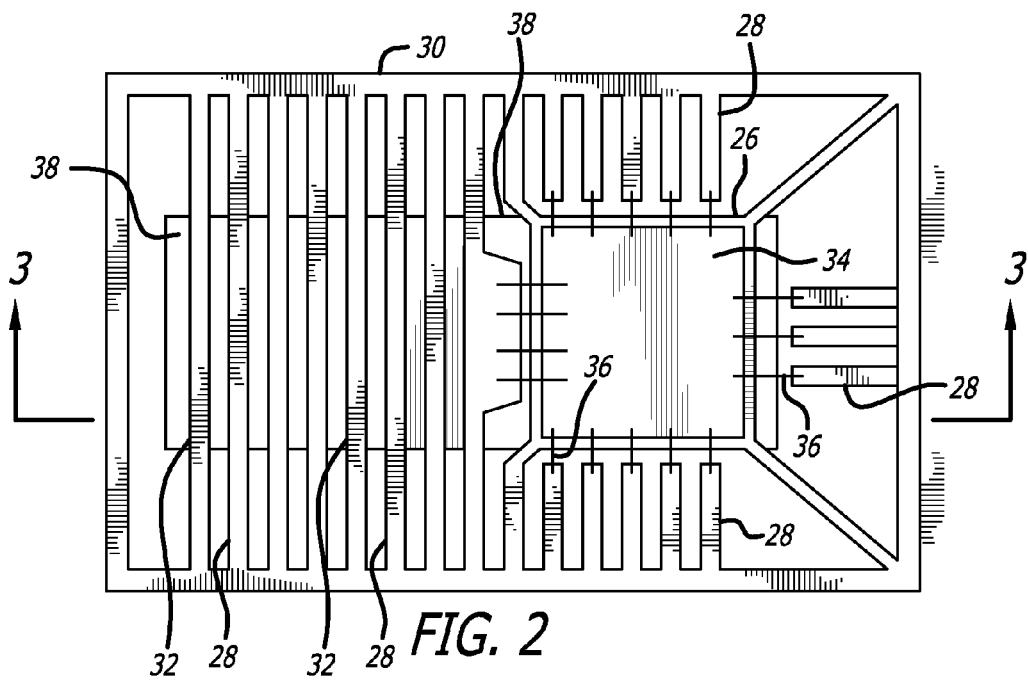
FIG. 2 is a schematic top view of the exemplary lead frame of FIG. 1 on a ferrite plate and with an integrated circuit mounted thereon.
Figure 3:
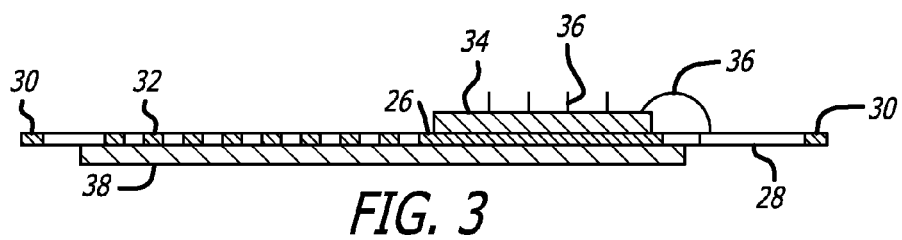
FIG. 3 is a cross section of the assembly of FIG. 2.
Figure 4:
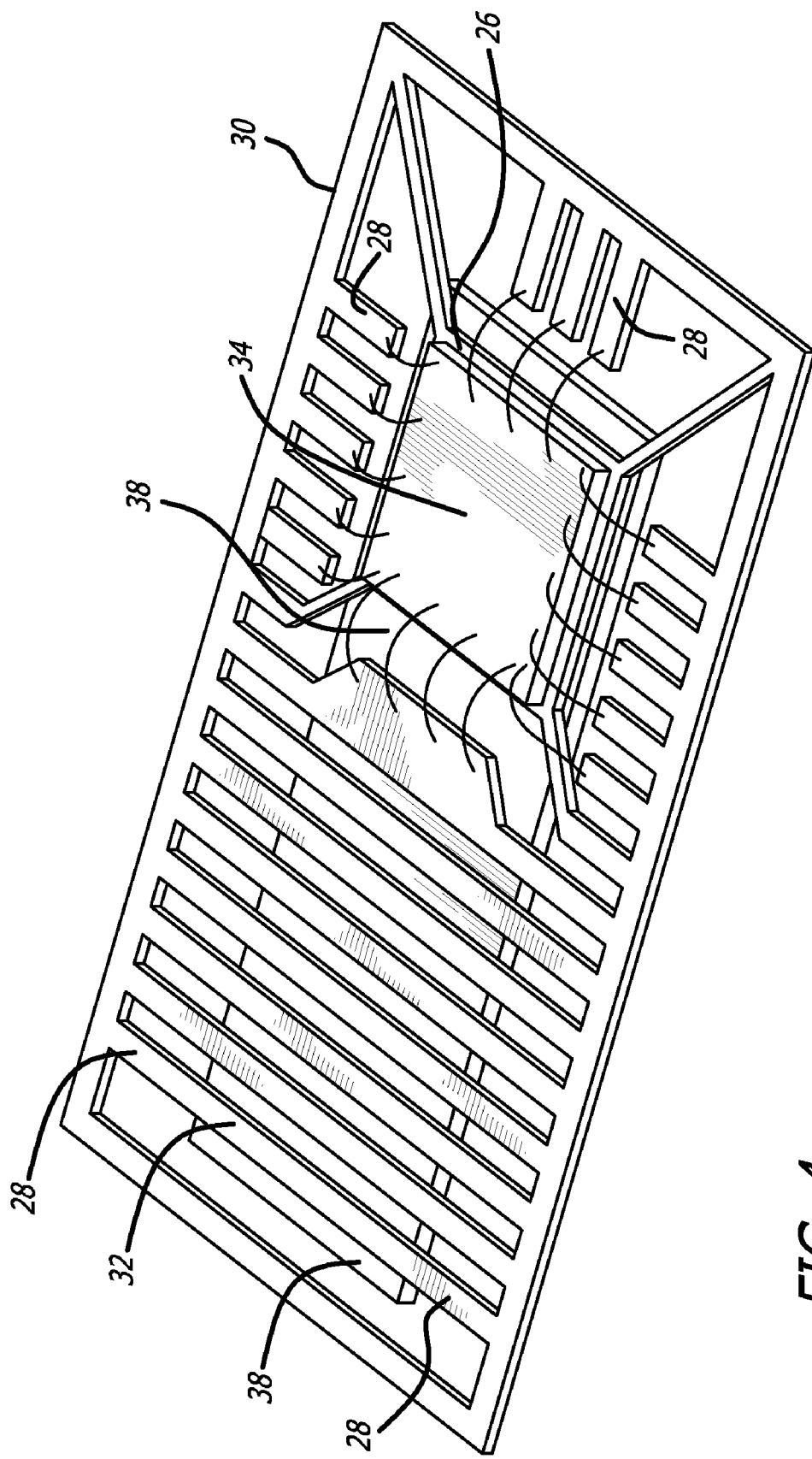
FIG. 4 is a perspective view of the assembly of FIG. 2.
Figure 5:
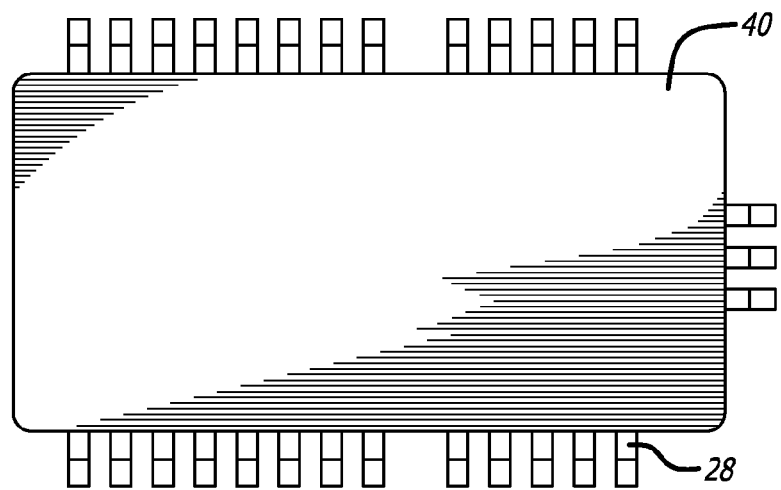
FIG. 5 is a top view of the completed package comprising the encapsulated assembly of FIGS. 2, 3 and 4.
Figure 7:
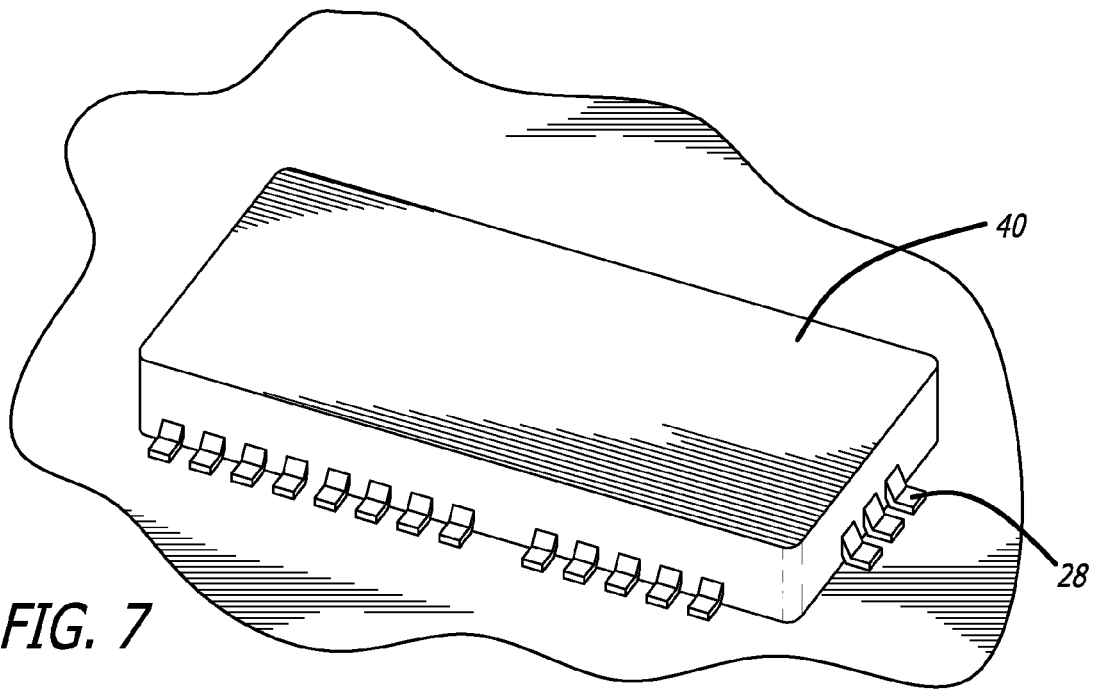
FIG. 7 is a perspective of the packaged circuit as mounted on a printed circuit board.

In the process of packaging an integrated circuit, the integrated circuit 34 will be mounted on pad 26 and wire bonded to the leads 28 and to the first coil segment 32 at the left side of the integrated circuit by wire bonding connections 36 as shown in FIG. 2, with a side cross section being shown in FIG. 3. These Figures show the entire lead frame assembly being positioned on a ferrite plate 38 which extends under the connections 32 in the left area 22 of the lead frame to beyond the edge of pad 26, as also illustrated in the perspective view of FIG. 4. The ferrite plate may be first coated with a suitable insulative material, if desired, to augment the normally very high resistivity of ferrite. The integrated circuit 34 and ferrite plate 38 are then encapsulated in resin 40 as shown in FIG. 5, with the leads 28 extending from the molding being cut from the lead frame periphery 30 and bent for resting on contact pads on a printed circuit board for soldering to the printed circuit board, as illustrated in FIG. 7.

Figure 8:
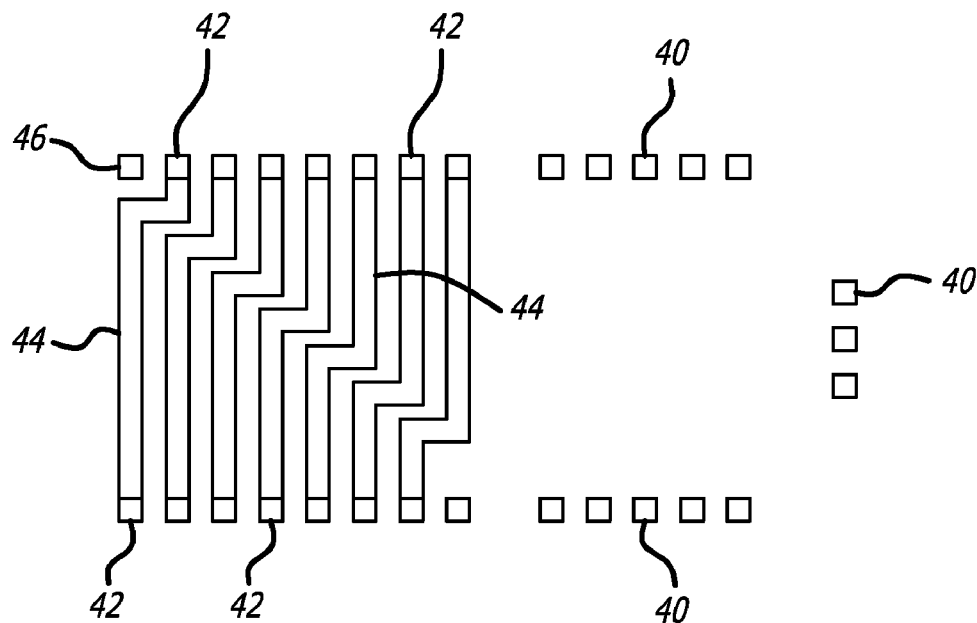
FIG. 8 is a plan view of exemplary printed circuit board traces in accordance with the present invention.

The local layout of the printed circuit board itself is shown in FIG. 8. The printed circuit board would have contact pads 40 for the integrated circuit, with the routing (not shown) being in accordance with the connection of the integrated circuit to other circuits on the printed circuit board. The printed circuit board would also have contacts 42 which connect one end of lead frame connections 32 to the other end of the next lead frame connection 32. This connects each of connections 32 over the top of ferrite plate 38 to a connection 44 under the ferrite plate, and from there to the next connection 32 over the top of the ferrite plate, etc. In essence, connections 32 over the top of the ferrite plate 38 and connections 44 on the printed circuit under the ferrite plate form coil segments which, when the packaged integrated circuit is soldered to the printed circuit board, are all connected in series to form one continuous multi-turn coil around the ferrite plate. In the embodiment schematically shown, this provides approximately seven and one-half turns around the ferrite plate, the multi-turn coil having a first end 46 and a second end 48. With the printed circuit board connection shown in FIG. 8, one the left coil end is wire bonded to the integrated circuit, and the other end is connected to respective printed circuit contact pad 40.

Figure 6:
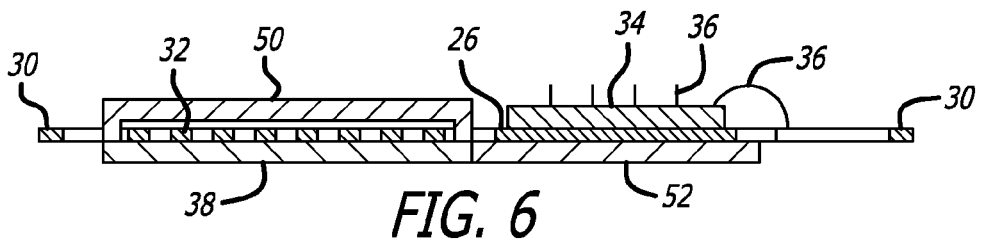
FIG. 6 is a cross section, similar to FIG. 3, of an alternate embodiment.
Figure 9:
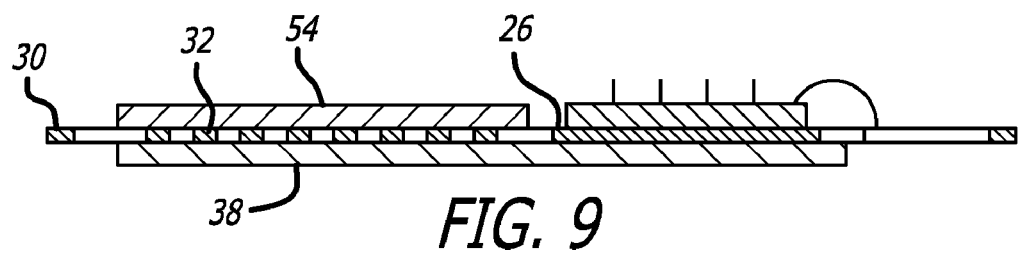
FIG. 9 is a cross section, similar to FIGS. 3 and 6, of a still further alternate embodiment.

The specific embodiment so far disclosed uses a ferrite plate that forms the core of the inductor, and further extends under the integrated circuit. This is convenient, as it is highly desirable to provide a flat surface for the lead frame to rest on while encapsulating the assembly. However this is not a necessity, as the ferrite plate need not extend under the integrated circuit for the inductor to function. Any loss in inductance would be relatively small, and easily more than made up for, if necessary, by using a top ferrite plate 50 (FIG. 6) over the lower ferrite plate and the coil segments on the lead frame, closing the magnetic circuit. Even if the ferrite plate 50 did not extend under the integrated circuit, one could still provide a flat surface for the lead frame to rest on while encapsulating the assembly by placing a plastic plate 52 of the same thickness as the ferrite plate 50 under the integrated circuit. For integrated circuits having substantial power dissipation, such as switching regulators with integrated switching transistors, a metal plate might be used for a more uniform temperature within the integrated circuit and better heat conduction away from the integrated circuit. While this would slightly further reduce the inductance, again this would easily more than be made up for, if necessary or desired, by using a top ferrite plate over lower ferrite plate and the coil segments on the lead frame, closing or nearly closing the magnetic circuit. In that regard, closing the magnetic circuit, particularly by using a "U" shaped upper ferrite plate essentially eliminates any part of a ferrite plate that extends under the integrated circuit from the magnetic circuit. Still, it is preferred to use a ferrite plate that forms the core of the inductor and further extends under the integrated circuit, as it reduces the number of parts used in the packaged device. In one embodiment, adequate inductance was provided without any top ferrite plate being used. Of course, if a top plate is used, it may be a simple flat ferrite plate 54, coated with insulation or not, as shown in FIG. 9, rather than the shaped top plate shown in FIG. 6.

Also it should be noted that in the embodiment disclosed, the coil segments forming part of the lead frame are aligned straight across the lead frame and the traces (coil segments) on the printed circuit board are effectively slanted to connect the coil segments into a single, multi-turn coil. However the reverse could be used. The coil segments forming part of the lead frame could be slanted across the lead frame and the traces (coil segments) on the printed circuit board effectively straight across to connect the coil segments into a single, multi-turn coil. Also, while connections between the multi-turn coil and the integrated circuit in the embodiment disclosed are made on the circuit board, such connections may be made by wire bonding prior to encapsulation.

Figure 10:
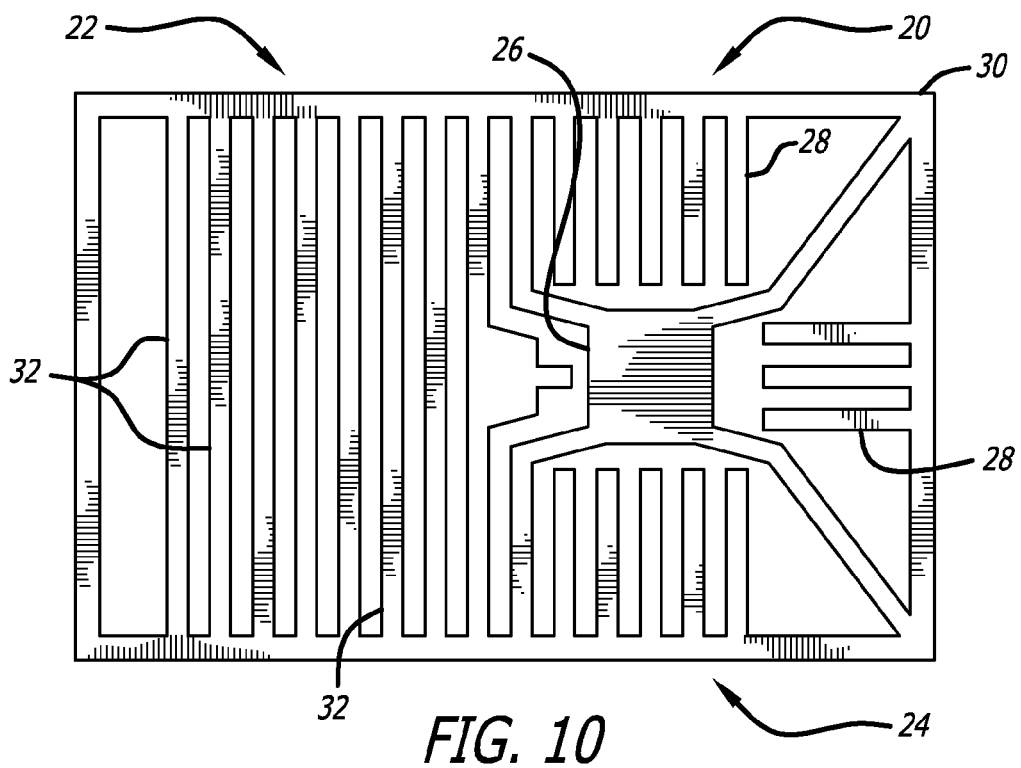
FIG. 10 is a schematic top view of an alternate exemplary lead frame that may be used with the present invention.
Figure 11:
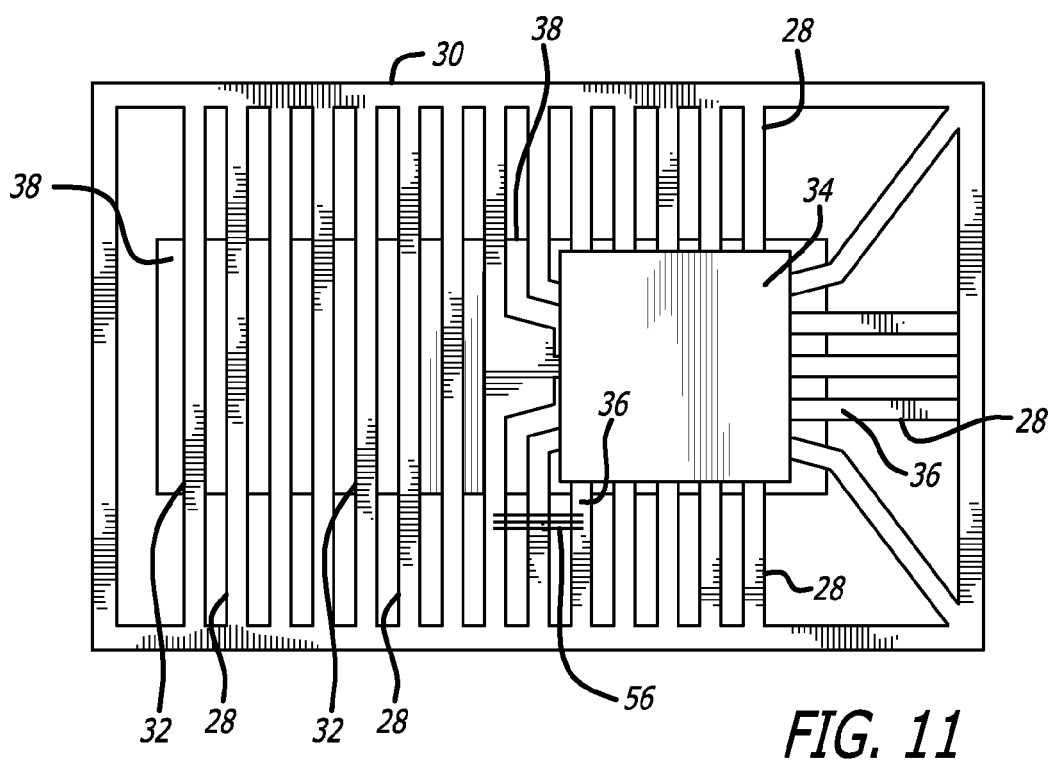
FIG. 11 is a schematic top view of the exemplary alternate lead frame of FIG. 1 on a ferrite plate and with an integrated circuit mounted thereon using flip-chip techniques.

By way of example, FIGS. 10 and 11 illustrate an embodiment using Flip-chip packaging. The lead frame itself, shown schematically in FIG. 10, is similar to that of FIG. 1, though with a smaller integrated circuit pad to allow the individual lead frame leads to extend under the integrated circuit 34 for solder ball bonding thereto. The printed circuit connections for this embodiment may be the same as shown in FIG. 8.

While the coil segments in the embodiments disclosed are connected so that the coils are physically in order, this is not a limitation of the invention. The coils may be connected in any physical order, provided they are connected with the same winding sense. This may be of benefit if both the start and finish connections are to be connected to the integrated circuit, as it would allow both the start and the finish connections to be adjacent the integrated circuit for more convenient connections.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A packaged integrated circuit comprising:
a first ferrite plate;
a lead frame above the first ferrite plate, the lead frame having a plurality of lead frame contacts and a pad for supporting an integrated circuit;
the integrated circuit mounted on a top surface of the pad, the integrated circuit having integrated circuit connections connected to a first plurality of the lead frame contacts in a first area of the lead frame;
a second plurality of lead frame contacts at opposite sides of the first ferrite plate, each of the second plurality of lead frame contacts at a first of the opposite sides being connected to a respective lead frame contact at a second of the opposite sides by lead frame connections extending over the first ferrite plate;
the first ferrite plate, the integrated circuit, the lead frame connections extending over the second area of the first ferrite plate, the integrated circuit connections connected to a first plurality of lead frame contacts and part of each lead frame contact being encapsulated in resin as a unitary package with the lead frame contacts being electrically accessible at the bottom of the unitary package.

2. The packaged integrated circuit of claim 1 further comprised of a second ferrite plate over the first ferrite plate and the connections extending over the first ferrite plate.

3. The packaged integrated circuit of claim 1 wherein the integrated circuit comprises a switching regulator controller and power transistors for a switching regulator.

4. The packaged integrated circuit of claim 1 further comprising, within the encapsulation, at least one wire bond electrically connecting an integrated circuit connection to an adjacent connection extending over the second area of the first ferrite plate.

5. The packaged integrated circuit of claim 4 wherein the integrated circuit connections to a first plurality of lead frame contacts are wire bond connections.

6. The packaged integrated circuit of claim 1 wherein the integrated circuit connections to a first plurality of lead frame contacts are flip-chip connections.

7. The packaged integrated circuit of claim 6 further comprising a flip-chip connection between an integrated circuit connection and an adjacent connection extending over the second area of the first ferrite plate.

8. The packaged integrated circuit of claim 1 on a printed circuit board, the printed circuit board having printed circuit connections for connecting to the connections extending over the second area of the first ferrite plate to form a single, multi-turn coil around the ferrite plate.

9. The packaged integrated circuit of claim 1 wherein the first ferrite plate extends under the pad.

10. The packaged integrated circuit of claim 1 wherein the first ferrite plate does not extend under the pad.

\* \* \* \* \*